(12) United States Patent
Li et al.

(10) Patent No.: US 10,811,353 B2
(45) Date of Patent: Oct. 20, 2020

(54) SUB-GROUND RULE E-FUSE STRUCTURE

(71) Applicant: International Business Machines Corporation, Armonk, NY (US)

(72) Inventors: Baozhen Li, South Burlington, VT (US); Chih-Chao Yang, Glenmont, NY (US); Andrew Tae Kim, Poughkeepsie, NY (US); Ernest Y Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 16/167,122

(22) Filed: Oct. 22, 2018

(65) Prior Publication Data
US 2020/0126911 A1    Apr. 23, 2020

(51) Int. Cl.
*H01L 23/525* (2006.01)
*H01H 85/08* (2006.01)
*H01H 85/143* (2006.01)
*H01H 69/02* (2006.01)
*H01L 21/768* (2006.01)

(52) U.S. Cl.
CPC ....... *H01L 23/5256* (2013.01); *H01H 69/022* (2013.01); *H01H 85/08* (2013.01); *H01H 85/143* (2013.01); *H01L 21/76864* (2013.01); *H01L 21/76882* (2013.01)

(58) Field of Classification Search
CPC ........... H01L 23/5256; H01L 21/76864; H01L 21/76882; H01H 69/022; H01H 85/06; H01H 85/08; H01H 85/10; H01H 85/143
See application file for complete search history.

(56) References Cited

U.S. PATENT DOCUMENTS 5,358,736 A * 10/1994 Mukai ................ C23C 14/025
427/123
5,367,280 A * 11/1994 Thiel ..................... H01C 7/13
29/623

(Continued)

OTHER PUBLICATIONS

R. F. Rizzolo et al., "IBM System z9 eFUSE applications and methodology," IBM Journal of Research and Development, vol. 51, Issue 1-2, Jan. 2007, pp. 65-75.

(Continued)

*Primary Examiner* — Victoria K. Hall
(74) *Attorney, Agent, or Firm* — Jeffrey S LaBaw; Steven J Meyers; Alvin Borromeo

(57) ABSTRACT

A mandrel structure includes a first mandrel, a second mandrel and a third mandrel in a parallel arrangement. The second mandrel is located between the first and third mandrels and has a cut larger than a minimum ground rule feature. A sidewall layer is formed over the mandrel structure. The sidewall layer has two long parallel gaps for two contact lines and a third gap for a fuse element. The third gap is orthogonal to and connects the two long parallel gaps. The sidewall pattern is used to form a trench structure comprising two parallel contact line trenches having a width at least as great as a ground rule of the patterning process for the contact lines and an orthogonal fuse element trench having a width less than the ground rule for the fuse element. A conductive material forms the contact lines and a fuse element.

19 Claims, 16 Drawing Sheets

(56) References Cited

U.S. PATENT DOCUMENTS

| | | | | |
|---|---|---|---|---|
| 6,586,985 | B1* | 7/2003 | Romas, Jr. | H01L 27/0802 257/E23.149 |
| 6,979,625 | B1* | 12/2005 | Woo | H01L 21/76877 257/E21.309 |
| 7,265,013 | B2 | 9/2007 | Furukawa | |
| 7,288,804 | B2 | 10/2007 | Booth | |
| 7,323,761 | B2* | 1/2008 | Park | H01L 23/5252 257/530 |
| 7,674,691 | B2* | 3/2010 | Cestero | H01L 23/5252 257/530 |
| 7,759,226 | B1* | 7/2010 | Lee | H01L 23/5256 257/209 |
| 7,817,455 | B2* | 10/2010 | Fredeman | G11C 17/16 365/189.09 |
| 9,024,411 | B2* | 5/2015 | Li | H01L 23/5256 257/529 |
| 9,093,453 | B2* | 7/2015 | Li | H01L 23/5256 |
| 9,685,404 | B2 | 6/2017 | Bao | |
| 9,735,104 | B1* | 8/2017 | Kim | H01L 23/5329 |
| 9,812,394 | B2 | 11/2017 | Cheng | |
| 9,859,209 | B2 | 1/2018 | Edelstein | |
| 9,893,012 | B2* | 2/2018 | Edelstein | H01L 23/5256 |
| 9,893,014 | B1 | 2/2018 | Fogel | |
| 9,953,868 | B2* | 4/2018 | Chen | H01L 23/53238 |
| 10,032,716 | B2 | 7/2018 | Edelstein | |
| 10,134,631 | B2* | 11/2018 | Horak | H01L 21/76814 |
| 2003/0168714 | A1* | 9/2003 | Daubenspeck | H01L 23/5256 257/529 |
| 2004/0012090 | A1* | 1/2004 | Basol | H01L 21/2885 257/755 |
| 2005/0029010 | A1* | 2/2005 | Ahn | H01L 21/76877 174/255 |
| 2005/0272258 | A1* | 12/2005 | Morita | H01L 21/2855 438/660 |
| 2006/0091551 | A1* | 5/2006 | Lin | C25D 3/58 257/762 |
| 2006/0157819 | A1 | 7/2006 | Chang | |
| 2007/0026579 | A1* | 2/2007 | Nowak | H01L 23/5256 438/149 |
| 2008/0217735 | A1* | 9/2008 | Chen | H01L 23/5256 257/529 |
| 2009/0045388 | A1* | 2/2009 | Clevenger | G11C 17/165 257/4 |
| 2009/0090993 | A1* | 4/2009 | Henson | H01L 23/5256 257/529 |
| 2009/0096059 | A1* | 4/2009 | Chinthakindi | H01L 23/5256 257/529 |
| 2009/0108396 | A1* | 4/2009 | Chidambarrao | H01L 23/5256 257/529 |
| 2010/0032797 | A1 | 2/2010 | Takewaki | |
| 2012/0074520 | A1* | 3/2012 | Yang | H01L 21/76805 257/529 |
| 2012/0261254 | A1* | 10/2012 | Reid | C25D 7/123 204/227 |
| 2012/0306048 | A1* | 12/2012 | Li | G11C 17/16 257/529 |
| 2013/0043556 | A1* | 2/2013 | Horak | H01L 23/5256 257/529 |
| 2013/0115767 | A1* | 5/2013 | Yang | H01L 21/76877 438/652 |
| 2013/0127055 | A1* | 5/2013 | Chen | H01L 23/53238 257/751 |
| 2013/0176073 | A1* | 7/2013 | Bao | H01L 21/76807 327/525 |
| 2014/0183739 | A1* | 7/2014 | Li | H01L 21/76871 257/751 |
| 2014/0210041 | A1* | 7/2014 | Burke | H01L 23/53295 257/529 |
| 2014/0332923 | A1* | 11/2014 | Filippi | H01L 23/5256 257/529 |
| 2014/0346674 | A1* | 11/2014 | Bao | H01L 23/53276 257/741 |
| 2015/0097266 | A1* | 4/2015 | Li | H01L 23/5256 257/529 |
| 2015/0115401 | A1* | 4/2015 | Zhang | H01L 28/20 257/530 |
| 2015/0137377 | A1* | 5/2015 | Bao | H01L 23/5226 257/758 |
| 2015/0322587 | A1* | 11/2015 | Pabelico | C25D 5/50 205/123 |
| 2015/0325477 | A1* | 11/2015 | Shaviv | H01L 21/2885 205/123 |
| 2016/0204064 | A1* | 7/2016 | Horak | H01L 21/76814 257/529 |
| 2016/0293484 | A1* | 10/2016 | Lee | H01L 21/76882 |
| 2017/0018499 | A1* | 1/2017 | Chen | H01L 23/5256 |
| 2017/0229395 | A1* | 8/2017 | Kim | H01L 23/5329 |
| 2017/0278793 | A1* | 9/2017 | Edelstein | H01L 23/5256 |
| 2018/0323067 | A1* | 11/2018 | Shu | H01L 21/0337 |
| 2019/0273047 | A1* | 9/2019 | Yang | H01L 23/53252 |
| 2019/0326209 | A1* | 10/2019 | Shu | H01L 21/76877 |

OTHER PUBLICATIONS

Nicholas V. LiCausi et al., "Patterning method impact on sub-36nm pitch interconnect variability," Proc. of SPIE, vol. 10588, 1058804, 2018, 12 pp.

* cited by examiner

A-A

A-A

A-A

A-A

A-A

A-A

A-A

A-A

A-A

SUB-GROUND RULE E-FUSE STRUCTURE

BACKGROUND OF THE INVENTION

This disclosure relates to integrated circuit devices. More specifically, it relates to a method and structure to create e-Fuse structures in semiconductor devices with advanced metallization.

As the dimensions of modern integrated circuitry in semiconductor chips continue to shrink, conventional lithography is increasingly challenged to make smaller and smaller structures.

E-Fuses, or simply fuses or fuse structures, are utilized within integrated circuit devices for a variety of purposes, such as programming certain functionality into the device or to enable or disable various devices within the circuit device. Such fuse structures can break electrical connections (such as in physically destroyable fuses or anti-fuses). As the dimensions of the circuitry become ever smaller, it is desirable to reduce the power needed to program integrated circuits. Yet with advanced metallurgy, metals other than copper are used to form the interconnecting metallurgy in which the e-Fuses are also formed. These metals have higher melting points and excellent electromigration (EM) resistance which require higher programing power rather than lower programming power.

Also, advanced patterning processes, such as self-aligned double patterning (SADP) and self-aligned quadruple patterning (SAQP), have layout limitations which make traditional fuse shapes with a relatively narrower fuse element and wider contact portions difficult to fabricate.

Thus, it is desirable to provide processes which can be used to make improved fuse structures for integrated circuitry.

BRIEF SUMMARY

According to this disclosure, an advanced e-Fuse device and a method for fabricating the e-Fuse device. A mandrel structure is provided over a dielectric using a patterning process. The mandrel structure includes a first mandrel, a second mandrel and a third mandrel in a parallel arrangement. The second mandrel is located between the first and third mandrels and has a cut larger than a minimum ground rule feature. A sidewall layer is formed over the mandrel structure. The sidewall layer has two long parallel gaps for two contact lines and a third gap for a fuse element. The third gap is orthogonal to and connects the two long parallel gaps. The mandrel structure is removed. The sidewall pattern is used to etch the dielectric to form a trench structure comprising two parallel contact line trenches having a width at least as great as a ground rule of the patterning process for the contact lines and a connecting, orthogonal fuse element trench having a width less than the ground rule for the fuse element. The trenches are filled with conductive material to form the contact lines and a fuse element. The contact lines function as an anode and a cathode in the e-Fuse.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
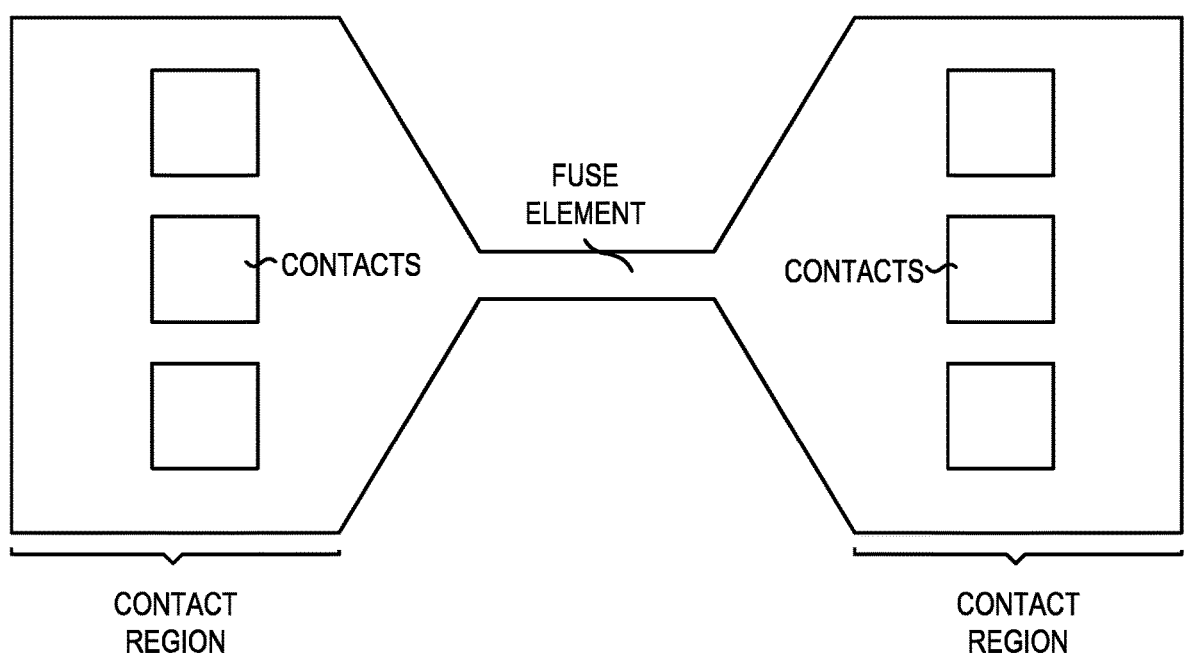
FIG. 1 is a top view diagram of a prior art e-Fuse structure.

At a high level, the invention includes an e-Fuse structure and a method for fabricating an e-Fuse structure with improved programmability by using a sidewall process for creating a fuse element feature having a smaller cross-section, i.e. a sub-ground rule, than a typical feature in the interconnect layer. The smaller cross-section increases the electromigration resistance (EM-resistance) difference between the cathode and anode ends as compared to the fuse element of the e-Fuse element. The smaller cross-section in this invention is created by the smaller width dimension of the fuse element. In preferred embodiments, the invention takes advantage of a special feature of SADP and SAQP patterning to make an e-Fuse with a sub-ground rule fuse element. Within the description "sub-ground rule" means a feature which is smaller than the standard technology minimum features which can be provided in the lithography process which creates other features of the integrated circuit.

A sub-ground rule dimension allows lower power programming. As an additional advantage, forming the e-Fuse is compatible with existing processing for interconnects in the same level. In some embodiments, no additional masks or processing steps are needed. In embodiments of the invention, the same conducting materials are used in both the ends (cathode/anode) and the central fuse element of the e-Fuse. In other embodiments of the invention, different conducting materials are used for the cathode and anode elements as compared to the fuse element.

Both SADP and SAQP are sidewall patterning processes; other embodiments of the invention use other sidewall processes. For example, a nominal technology minimum metal width (ground rule) is 24 nm, a sub-ground rule metal width is <24 nm, for example, 12 nm.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

"Electromigration" is a term applied to the transport of mass in metals when the metals are subjected to high current density. "Electromigration resistance" or "EM-resistance" is a property of a metal which is resistant to this effect.

An e-Fuse is a passive device as compared to active devices such as FET based devices. While the process steps to fabricate one embodiment of the invention are used with a planar metal-oxide-semiconductor field-effect transistor (MOSFET) device, since the e-Fuse is a back-end of line (BEOL) passive device, it works for any of the front-end of line (FEOL) devices. E.g., other embodiments described below are incorporated in other devices having source/drain regions and gate structures such as fin field effect transistors (FinFETs). Electrical fuses (e-Fuses) are used in the semiconductor industry to implement array redundancy, field programmable arrays, analog component trimming circuits, and chip identification circuits. Programming of the prior art electrical fuses typically takes a substantial amount of current, which is undesirable in current technology node devices using low driving current. In addition, programming transistors requires space in a semiconductor chip, as well as power consumption.

Embodiments will be explained below with reference to the accompanying drawings.

FIG. 1 is a top diagram of a prior art e-Fuse structure. E-Fuse technology was invented by IBM to allow for dynamic real-time reprogramming of computer chips. Although computer logic is generally "hard-coded" onto a chip and cannot be changed after the chip is manufactured, through the use of a set of e-Fuses, a chip manufacturer can allow for the circuits on a chip to change while it is in operation. The technology can provide in-chip performance tuning. If certain sub-systems fail, or are taking too long to respond, or are consuming too much power, the chip can instantly change its behavior by "blowing" an e-Fuse. The process creating opens at selected e-Fuses is also called "programming". E-Fuses are used in the semiconductor industry to implement array redundancy, field programmable arrays, analog component trimming circuits, chip identification circuits and other devices.

In the prior art e-Fuse structures, an in-plane dimensional difference between the cathode and anode located at the ends of the e-Fuse and the central stripe or fuse element. The narrow dimension of the fuse element localizes the site where a circuit open is created, i.e. in the fuse element. During programming, a positive voltage bias is applied to the anode contact region and a negative voltage at the cathode contact region through the contacts. Increased local current density is obtained at the narrow cross-section of the fuse element, or fuselink, which also elevates the temperature. For example, as shown in FIG. 1, a "dog-bone" shaped e-Fuse is known, including a fuse element having a smaller cross-sectional area between the larger cross-sectional area cathode and anode pads. The narrowing of cross-sectional area increases local current density in the fuse element. This type of fuse structure has been adopted in the semiconductor industry. Nonetheless, as the dimensions of other devices in the integrated circuits continue to shrink, there is a continued need for e-Fuse elements which can be fabricated with the new technologies.

The combination of high current density with the elevated temperature at the fuse element facilitates electromigration of the conductive material at the fuse element. Electrically "blowable" fuses take advantage of the electromigration (EM) effect to open an electrical connection. In a two-dimensional, dog-bone shaped e-Fuse, such as that shown in FIG. 1, voids form at the small cross-section center fuse element due to high current density during programming, and eventually, create an electrically open circuit. It is also known that electromigration causes the conductive material to pile-up and form hillocks at the anode (most positive) end of the fuse element. Hillock formation is an undesirable effect.

However, as mentioned above, the prior art "dog-bone" shape has become difficult to fabricate in modern semiconductor designs. Due to patterning difficulties for new technologies, it is very hard to make a shape of a minimum width wire connecting to a wide portion at the same level; the shape shown in FIG. 1 is "not allowed" in the design rules for SADP. Advanced patterning processes, such as self-aligned double patterning (SADP) and self-aligned quadruple patterning (SAQP), have layout limitations which make traditional fuse shapes, e.g., the "dog-bone" shown in FIG. 1, difficult to fabricate. The present invention allows a new e-Fuse configuration to be fabricated using advanced patterning processes, such as SADP and SAQP. A sidewall process used in these patterning processes creates a fuse element feature having a smaller cross-section than a typical feature in the interconnect layer, thus increasing the electromigration resistance (EM-resistance) difference between the cathode and anode ends and the fuse element of the e-Fuse. In embodiments of the invention, the same conducting materials are used in both the ends (cathode/anode) and the central fuse element of the e-Fuse. In other embodiments of the invention, different conducting materials are used for the cathode and anode elements as opposed to the fuse element.

Figure 2:
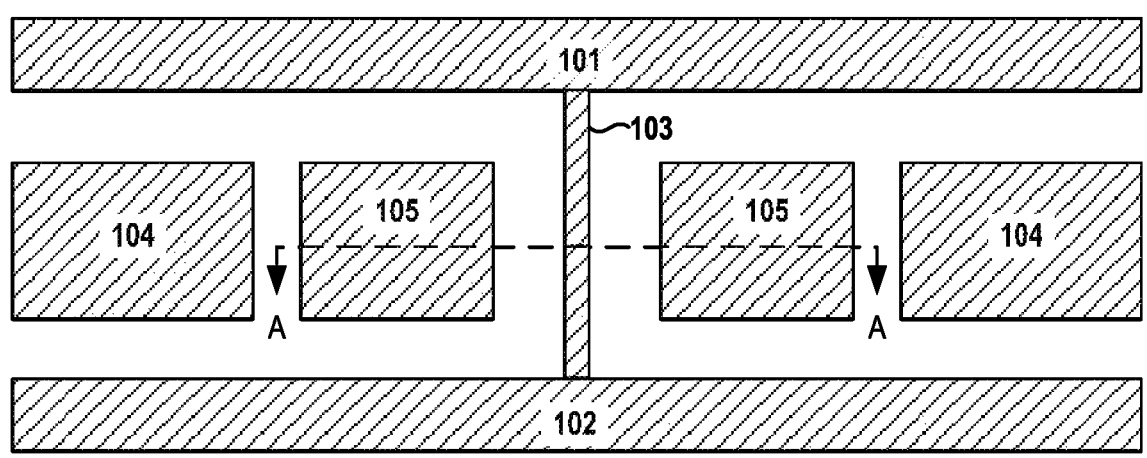
FIG. 2 is a top diagram of an e-Fuse structure in a first embodiment of the invention which also shows the orientation of the cross-sectional diagrams.

FIG. 2 is a top diagram of an e-Fuse structure in a first embodiment of the invention which also shows the orientation of the cross-sectional diagrams in following figures (along the AA line). In this drawing, only the conductive features of the e-Fuse are depicted. The anode and cathode 101, 102 are contact lines having a length dimension substantially greater than a width dimension. There is no strict requirement for the length of the contact lines in terms of the functioning of the e-Fuse. In preferred embodiments of the invention, the contact lines should be wide enough to support the fuse programing, and have a resistance low enough to not contribute substantially to the overall resistance of the fuse element. The contact lines 101, 102 are designed to be connected to other layers of the integrated circuit using vias or using metal lines in the same level.

The e-fuse element 103 has a smaller cross-section than the contact lines which serve as anode and cathode 101, 102 of the e-Fuse, and so, when a programming voltage is applied to the e-Fuse, the fuse element 103 is most likely to create an open in the circuit.

Elements 104, 105 which are located between the contact lines 101, 102 depict regular interconnect features in the layer, e.g., a metal line or via, in embodiments of the invention. In other embodiments, one or both of the features 104 and 105 are "dummy" features having no functional aspect in the integrated circuit. In alternative embodiments, elements 104 and 105 can be merged into a single element, e.g., a conductive metal line element. However, their positions are important so that the fuse element 103 and contact lines 101, 102 may be fabricated according to the invention. The inner edges of features 105 reflect the prior position of mandrels used to define the sub ground rule dimension of the fuse element. The edges facing the contact lines are similarly used to define the contact line dimensions. The breaks between features 104 and feature 105 allow a dummy feature 105 to be built in the proper position for the fuse element without impacting an active feature 104 used elsewhere in the integrated circuit, e.g., as a via or a line. In embodiments of the invention, the breaks between the features 104, 105 can occur some distance away from the fuse element, but for ease of illustration, they are positioned nearby.

Figure 3:
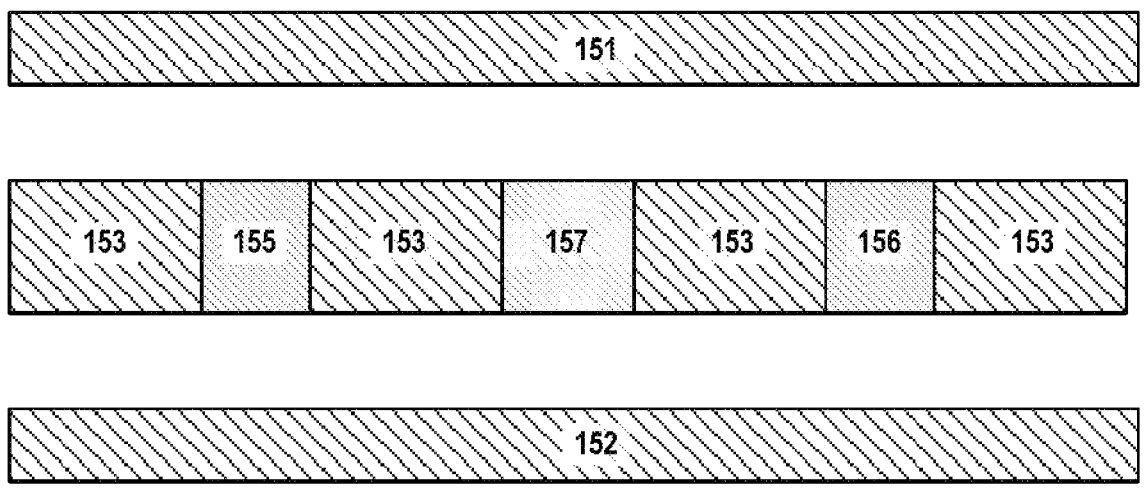
FIG. 3 is a top diagram depicting the e-Fuse structure after a patterning step has been performed according to a first embodiment of the invention.

FIG. 3 is a top diagram depicting the e-Fuse structure after a patterning step has been performed according to a first embodiment of the invention. In the drawing, a set of three mandrel lines are shown. Mandrel lines 151 and 152 are used to form the contact lines and surrounding interconnection metallurgy. Mandrel line 153 has a set of gaps 155, 156 and 157 which are cut into the mandrel by prior processing to break the mandrel line 153 into segments for different features (dummy features or active features) and the fuse element in future processing. In preferred embodiments, the mandrel cut gaps 155, 156 are a "standard ground-rule" width, while mandrel cut shape 157 is wider than the standard ground rule, i.e. wider than cut gaps 155, 156. For example, if mandrel cut gaps of 155, 156 are 40 nm wide, mandrel cut gap 157 is 45-55 nm wide in embodiments of the invention. The spaces between mandrel lines 151 and 153 and between mandrel lines 152 and 153 are preferably larger than the standard ground rule. A typical line width for mandrel lines 151, 152 and 153 is 20 nm-60 nm; typical spacing between mandrel lines is 50-80 nm. While mandrel line 153 is shown as wider than mandrel lines 151 and 152, this is not a requirement of the invention. As shown in the drawing, a self-aligned double patterning (SADP) process is used in this embodiment. In other embodiments, an SAQP process is used. In the SADP process, a first pattern is used to form the mandrels. An SADP process typically uses two masks, a core mask for patterning the mandrel and a trim (or cut) mask for removing any unnecessary patterns in the mandrel pattern. Since the most critical pattern control in SADP is the thickness of the sidewall spacer rather the alignment of the masks, it has excellent process repeatability.

The material used for the mandrels 151-153 will depend on the materials beneath the mandrels to be patterned. For example, in one embodiment, the mandrels are comprised of amorphous silicon (a-Si). The elements 151, 152 and 153 are three mandrel lines, and the spaces 155, 156 and 157 between them are spaces after mandrel patterning, that is, spaces cut in mandrel line 153 in a separate mandrel cut process.

Figure 4:
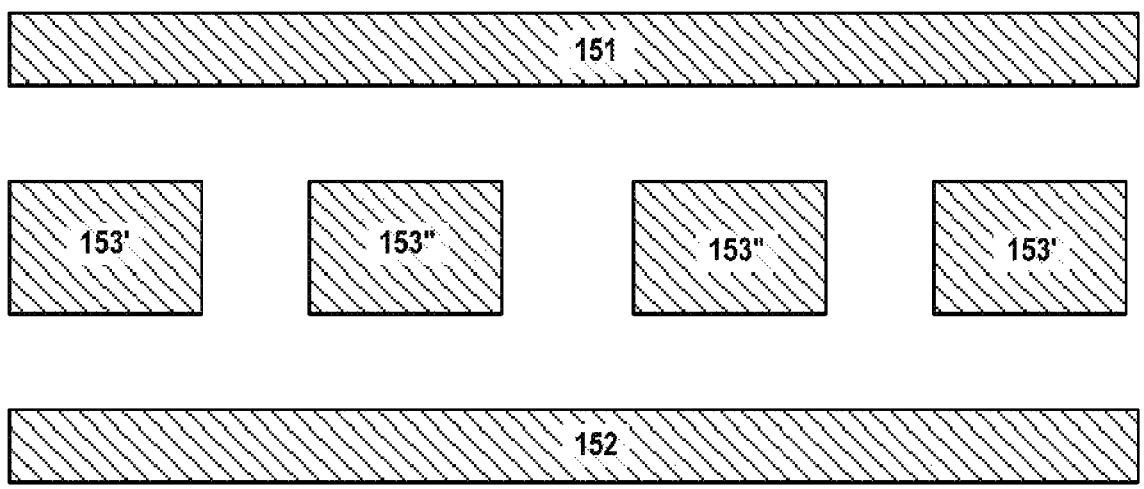
FIG. 4 is a top diagram of the e-Fuse structure after a mandrel cut process has been performed according to a first embodiment of the invention.

FIG. 4 is a top diagram of the e-Fuse structure after a mandrel cut process has been performed according to a first embodiment of the invention. As shown, the long mandrels 151 and 152 are for long interconnect metal lines. The fuse contact lines will be lines formed between mandrels 151 and 153', 153" and between mandrels 152 and 153', 153", and the fuse element will be formed between the two central mandrel elements 153". The spacing between the two central mandrel elements 153"s determines the width of the fuse element, and the width of the two central elements 153" determines the length of the fuse element. The mandrel segments of 153' and 153" can also form active interconnect segments connecting to different metal levels through vias. Alternatively, they can form dummy metal segments. One skilled in the art will appreciate that only a small portion of the mandrel mask is depicted as it is the portion needed to form the e-Fuse.

Figure 5:
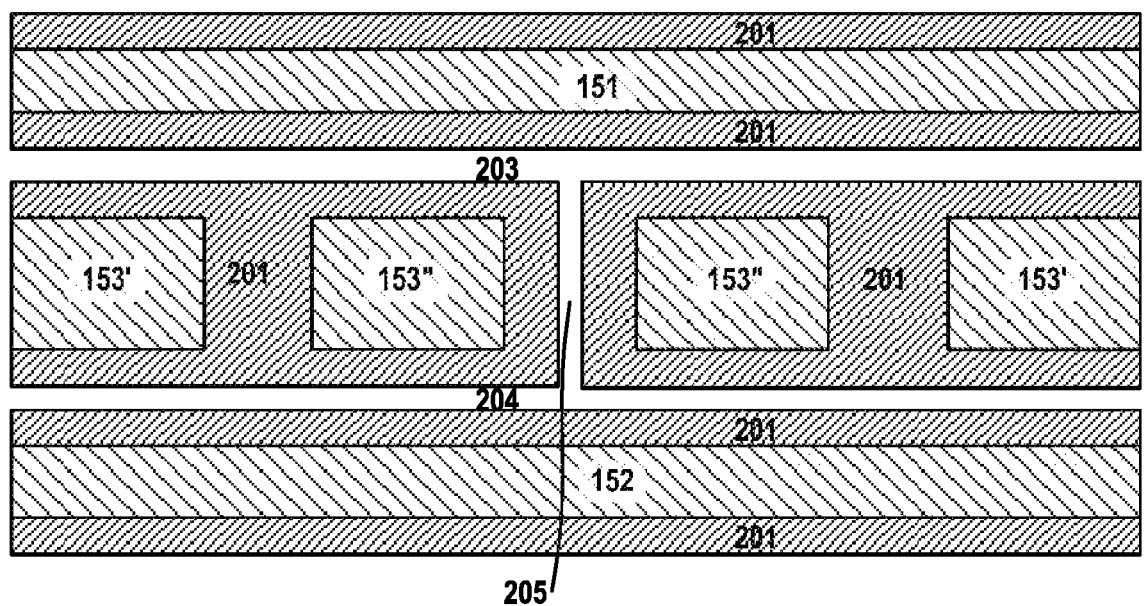
FIG. 5 is a top diagram depicting the e-Fuse structure after a spacer deposition and an initial spacer reactive ion etch (RIE) steps have been performed according to a first embodiment of the invention.

FIG. 5 is a top diagram depicting the e-Fuse structure after a spacer deposition step and an initial directional spacer reactive ion etch (RIE) step have been performed according to a first embodiment of the invention. This drawing shows how the spacer (or sidewall) material 201 is formed. A typical sidewall material for this step is SiO2, however, in other embodiments, other materials are used. Initially, the sidewall material is deposited over the mandrels 151-153", covering both the tops and sidewalls of the mandrels as well as the horizontal spaces between the mandrels. The directional RIE step removes the spacer material deposited on the top of the mandrel line and on the bottom of the white spaces. The drawing shows the process point after the etch process which removes the excess spacer material. In this process, only the sidewalls of the sidewall material are left on the mandrels after etching.

The material selected for the spacer material should have different etch characteristics than the mandrels. For example, if a-Si (amorphous silicon) is selected for the mandrels, SiO2 is a material which could be used for the sidewall material. In other embodiments of the invention, other materials are selected. The thicknesses of the mandrel layer and spacer layers are a function of the selectivity of the etch processes to underlying layers. In the case of the spacer layer, it is also a function of the dimensions of the desired features in the integrated circuit as the sidewalls will determine the widths of these features.

At this point in the process, one can see where the long parallel contact lines and the fuse element will be formed in the white spaces between the sidewall patterns. As can be seen, the fuse element will be oriented orthogonally to the contact lines. As shown in the drawing, white spaces 203 and 204 indicate the future positions of the contact lines. White space 205 is the future location of the fuse element.

Figure 6:
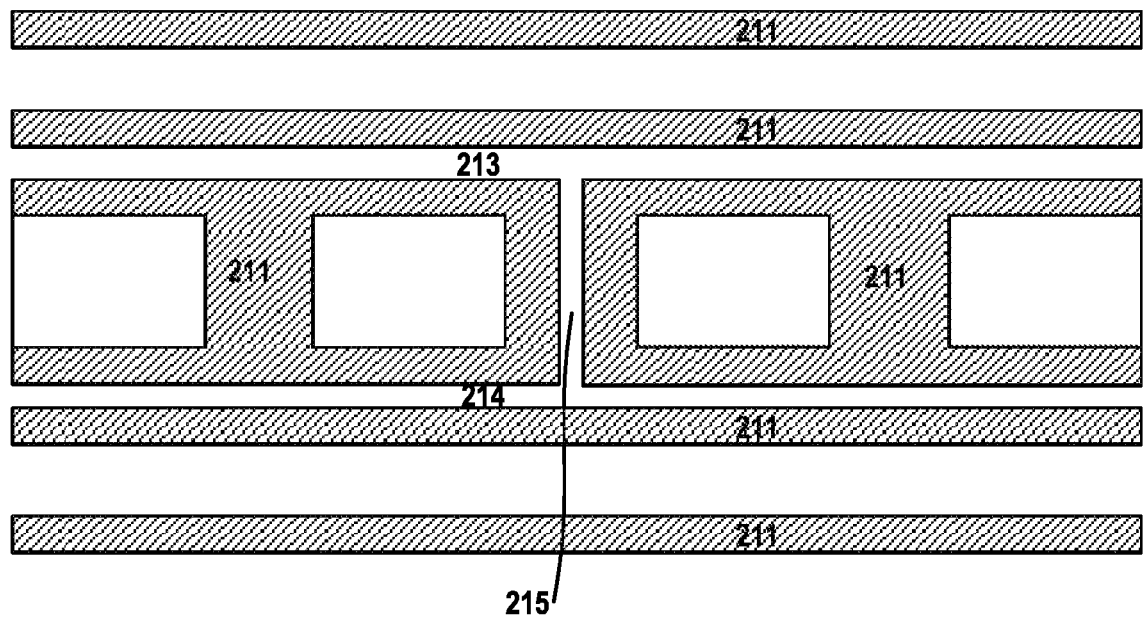
FIG. 6 is a top diagram of an e-Fuse structure after the full spacer RIB, a mandrel pull and an etch process transferring the pattern to a hard mask and the subsequent etch of an inter-layer dielectric (ILD) layer according to a first embodiment of the invention.

FIG. 6 is a top diagram of an e-Fuse structure after a mandrel pull and an etch process transferring the pattern to a hard mask and a full spacer removal and the subsequent etch of the pattern 211 into an inter-layer dielectric (ILD) layer according to a first embodiment of the invention. In the mandrel pull process, the sacrificial mandrel material is removed, leaving only the sidewall pattern. After the pattern is transferred to the hardmask, the spacer materials are removed. The mandrel pull and spacer removal processes are either wet etch or a reactive ion etch (RIE) processes depending on the materials selected.

In the process which transfers the sidewall pattern to the hard mask, so that the hard mask can function as the mask layer for the inter-layer dielectric (ILD) etch, an etch process selective to the hard mask layer (as compared to the sidewall material) is used. The hard mask layer is selected to have different etch properties as compared to the ILD layer. For example, in preferred embodiments, the hard mask layer is made of TiN, SiN, SiN/SiO2, SiBCN or SiOCN, in either a single or multi-layer mask or any combination thereof. A preferred embodiment uses TiN as the hard mask. Finally, the ILD layer is etched to the appropriate depth for the e-Fuse device as well as the other interconnections in this layer. The ILD layer is SiO2 or a low-k dielectric in embodiments of the invention.

In the drawing, the pattern 211 is the hard mask layer in some embodiments of the invention. In other embodiments, the hard mask layer is removed and the pattern 211 represents the top of the ILD layer.

Conventional deposition processes such as spin on, an atomic layer deposition (ALD), chemical vapor deposition (CVD) or plasma enhanced chemical vapor deposition (PECVD), are used to deposit the mandrel layer, sidewall material and hard mask layers. As shown in the drawing, white spaces 213 and 214 indicate the future positions of the contact lines. White space 215 is the future location of the fuse element.

Figure 7:
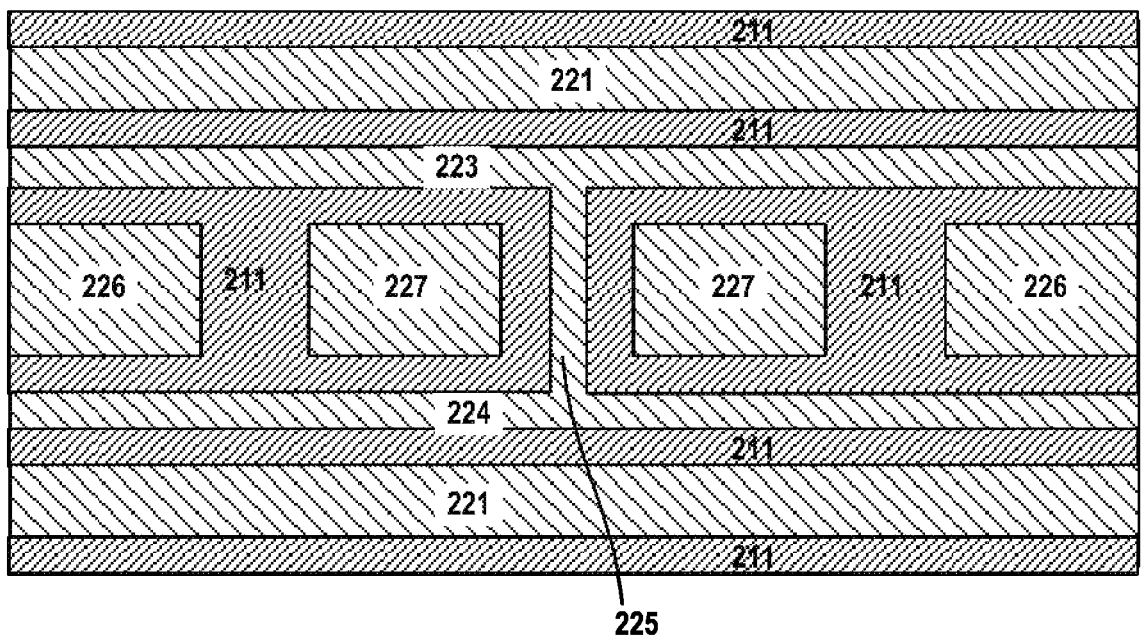
FIG. 7 is a top diagram depicting the e-Fuse structure after a metal fill and a chemical mechanical polishing (CMP) step has been performed according to a first embodiment of the invention.

FIG. 7 is a top diagram depicting the e-Fuse structure after a metal fill and a chemical mechanical polishing (CMP) step has been performed according to a first embodiment of the invention. The features denoted by 211 are the final dielectric pattern, i.e., the top of the ILD layer. In embodiments of the invention, the hard mask layer is removed by the CMP step. The conductive components, 221-227 are fabricated from a conductive material, for example, a metal such as W, Cu, Al, or alloys thereof. Conventional deposition processes such as an atomic layer deposition (ALD), chemical vapor deposition (CVD), plasma enhanced chemical vapor deposition (PECVD), electroless plating are used to deposit the metals or alloys in respective embodiments. As will be discussed below, an additional layer such as a barrier layer or multiple layers of metal can be used in embodiments of the invention.

After the deposition, a planarization process is performed. A chemical mechanical polishing (CMP) step is a widely used planarization process which is used in embodiments of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. Other planarization processes are known to the art and are used in alternative embodiments of the invention.

The e-Fuse device is comprised of contact lines 223, 224 and the fuse element 225. The contact lines 223, 224 respectively function as the anode and cathode of the device. The fuse element 225 is a "sub-ground rule" element and is thus thinner than the technology defined standard minimum width can produce. As discussed herein, the cross-section of the fuse element is smaller than that of the anode and cathode and so the open of the e-Fuse is localized to the fuse element when the programming voltage is applied to the device. In embodiments of the invention, the width of the contact lines is 1× or greater than the ground rule dimension, while the width of the fuse element is smaller than the ground rule, i.e. a fractional multiplier of the ground rule. For an SADP process, the minimum feature is defined by the spacer to overcome the lithography limitations.

In a preferred embodiment, elements 226 have via connections between the device layer below and higher levels of the interconnection structure. Elements 227 are dummy elements which have no function in the completed integrated circuit or active interconnections. In alternative embodiments, elements 227 are active elements as well. This is dependent on the design of the chip. The break between element 226 and 227 allows dummy elements to be created if needed to create the fuse element, without impacting the functioning of other elements. As shown in the figure, the direction of the longest dimension of the contact lines 223, 224 is orthogonal to the direction of the longest dimension of the fuse element 225. The fuse element 225 electrically connects the two contact lines 223, 224. The respective lengths of the contact lines 223, 224 can be trimmed during non-mandrel cut process based on design needs. Lines 221 represent other features in the integrated circuit not directly associated with the e-Fuse.

Figure 8:
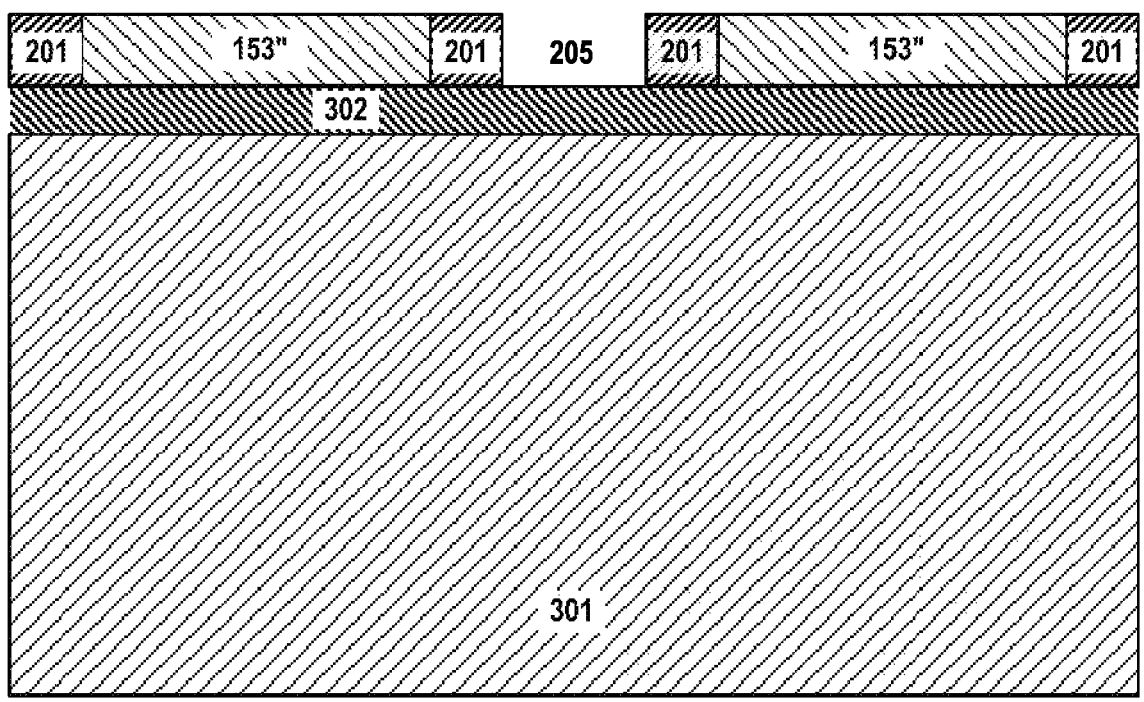
FIG. 8 is a cross-sectional diagram of an e-Fuse structure after a spacer deposition and an initial spacer reactive ion etch (RIE) steps have been performed according to a first embodiment of the invention, corresponding to the top view in FIG. 5.

FIG. 8 is a cross-sectional diagram of an e-Fuse structure after a spacer deposition and an initial spacer reactive ion etch (RIE) steps have been performed according to a first embodiment of the invention, corresponding to the top view in FIG. 5. The cross-sectional view corresponds to the AA line from FIG. 2. The drawing shows an inter-layer dielectric (ILD) layer 301 on which a hard mask 302 is disposed. The central mandrels 153" are disposed over the future positions of the dummy features. As described above, the mandrels 153" will be removed in the mandrel pull operation. The sidewall 201 surrounds the mandrels 153" and will provide a mask layer from which the hard mask 302 will be patterned as is described above. Because of the spacing of the mandrels 153", there is already a space 205 over the future position of the fuse element.

Figure 9:
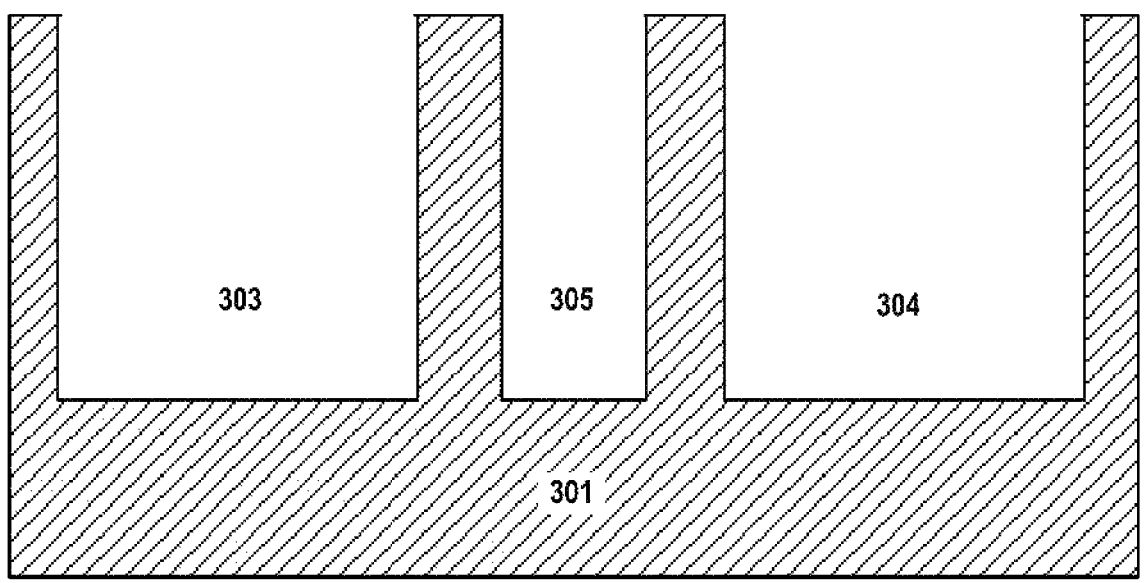
FIG. 9 is a cross-sectional diagram of an e-Fuse structure after the full spacer RIE, a mandrel pull and an etch process transferring the pattern to a hard mask and the subsequent etch of an inter-layer dielectric (ILD) layer according to a first embodiment of the invention corresponding to the top view in FIG. 6.

FIG. 9 is a cross-sectional diagram of an e-Fuse structure after the full spacer RIE, a mandrel pull and an etch process transferring the pattern to a hard mask and the subsequent etch of an inter-layer dielectric (ILD) layer according to a first embodiment of the invention corresponding to the top view in FIG. 6. The cross-sectional view corresponds to the AA line view from FIG. 2. In the drawing, the ILD 301 has three recesses, 303, 304 and 305. In this embodiment, recesses 303 and 304 are where the dummy (or active) elements are formed and have a ground rule width or above. Recess 305 shows the cross-section of the trench where the fuse element will go which has a "sub-ground rule" width, i.e. a width less than the ground rule. The depth of the recesses and trenches depends on the metal line height used in the layer in which the e-Fuse is fabricated. This height can range from 30 nm to 300 nm. For ease in illustration, the drawing only shows the recess layer near the fuse element; in other areas in the chip, metallization features (not shown) such as vias would be present below the recess embedded in the ILD 301 and contact a recess. If recess 303 was for a functional element, e.g., a via interconnect, a device or a contact would be shown directly underneath at least a portion of the recess 303 rather than the ILD layer 301.

The ILD 301 may be any suitable dielectric material such as, for example, low K dielectric materials, SiC, Si4NH3, SiO2, a carbon doped oxide, a nitrogen and hydrogen doped silicon carbide SiC(N,H) or multilayers thereof disposed over a substrate (not shown). The layer of dielectric material can be formed utilizing a conventional deposition process such as, for example, CVD, PECVD, and spin-on coating. The thickness of the blanket layer of dielectric material may vary depending on the technique used to form the same as well as the material make-up of the layer. Typically, the blanket layer of dielectric material has a thickness from 50 nm to 800 nm, with a thickness from 80 nm to 300 nm being more typical.

While the drawing is not necessarily to scale, the drawing and those that follow are intended to illustrate embodiments of the invention which use the difference in the widths of the features to increase the difference in current carrying capability between the contact lines and the fuse element. By depositing a first layer of a less electromigration (EM) resistant material first and then a second layer of a more EM resistant material (preferably with better conducting properties) second, a greater portion of the cross-sectional area of the fuse element is comprised of the first layer, as compared to the cross-sectional area of the contact lines. For example, a first layer such as a Al, Ag, or physical vapor deposition (PVD) Cu seed layer tends to be less EM resistant than the main conductor layer, e.g., plated copper (Cu), which makes up the majority of the interconnect. In an alternative embodiment, copper is used for the majority of the fuse element and Ru or Co as the main interconnect material.

Barrier layers are typically used to coat the sidewalls for all recesses and trenches. As the barrier layers typically are less conductive, more EM resistant and with high melting points, in preferred embodiments, the thickness of the barrier layer is relatively small as compared to the seed layer and the main conductive layer. That is, embodiments of the invention use a thickness sufficient to coat the sidewalls with the barrier layer, but not to fill the entire fuse element recess.

While the layout of the preferred embodiment of e-Fuse element does not allow the cross-section to show the widths of the contact lines, the widths of the dummy features are effective proxies as they similarly are at ground rule or above in width. Embodiments of the invention increase the difference between the contact lines and the fuse element by selecting a greater than ground rule width for the contact lines. In embodiments of the invention, the sub-ground rule fuse element is arranged at 90 degrees to the ground rule (or above) contact lines because of the geometries imposed by the SADP process. For example, with a ground rule minimum line with of 20 nm, the contact lines can be 20 nm-60 nm in width, and fuse element can be 8-16 nm in width in embodiments of the invention.

Figure 10:
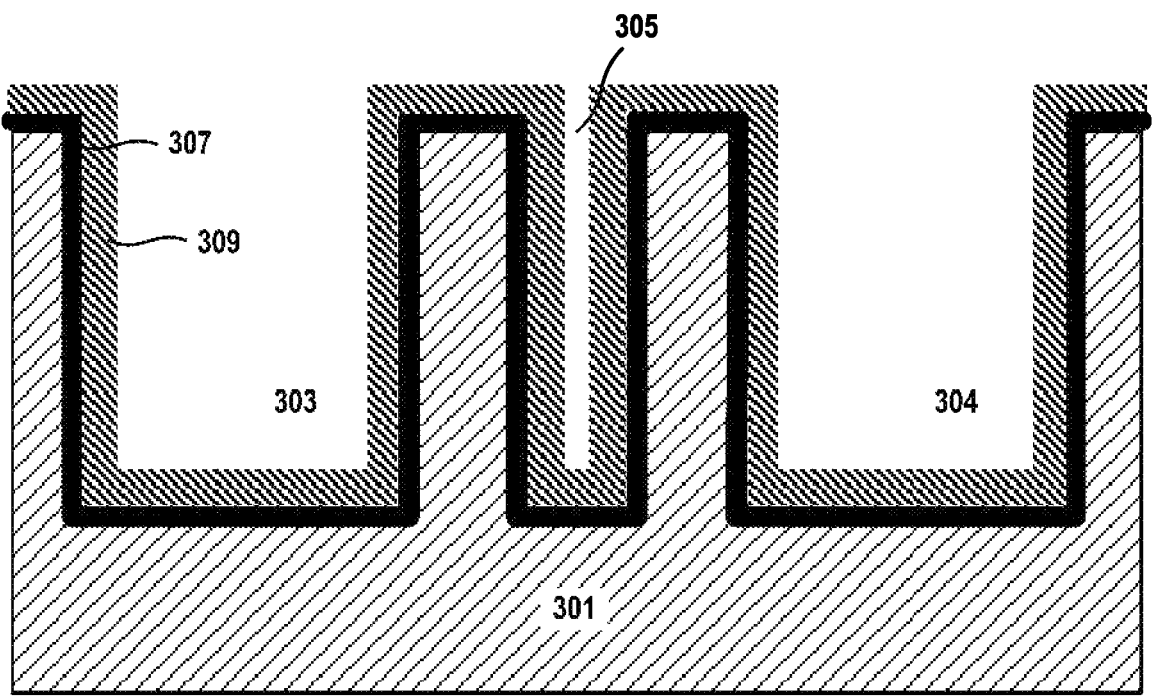
FIG. 10 is a cross-sectional diagram depicting the e-Fuse structure after a liner deposition step and a seed layer deposition step have been performed according to a first embodiment of the invention.

FIG. 10 is a cross-sectional diagram depicting the e-Fuse structure after a liner deposition step and a seed layer deposition step have been performed according to a first embodiment of the invention. The liner 307 is typically a barrier material which prevents the diffusion of the subsequent conductor, e.g., a copper layer, into the ILD dielectric 301. The seed layer 309 is typically a conductor layer which promotes the adhesion of the main conductor layer on the barrier layer liner and facilitates later main conductor deposition. The seed layer 309 can be the same metal which makes up the main conductor layer, but is deposited in a process which has better adhesion as compared to the deposition of the main conductor layer which may have a higher deposition rate. Alternatively, the seed layer can be a different material which promotes adhesion of the main conductor layer. In the context of this invention, the seed layer can be selected to have different EM properties than the main conductor layer. Since the earlier filled layers will comprise a greater proportion of the fuse element as compared to the contact lines, having a seed layer with poorer EM properties will cause the open to be more likely to occur at the fuse element during programming than if the fuse element and contact lines were made of a single material.

The deposition of liner material(s) 307 can be accomplished utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the liner can vary depending on the number of metal layers within the liner 307, the type of metal layer being formed and the technique used in forming the same. Typically, the liner 307 has a thickness from 1 nm to 20 nm, with a thickness from 2 nm to 10 nm being more typical. Suitable liner materials include Ta, Ti, W, Co, Ru, and their nitride materials, TaN, TiN, WN, CoN, RuN.

The deposition of the seed layer material 309 is performed using any conventional deposition process. As above, chemical vapor deposition (CVD), plasma enhanced chemical vapor deposition (PECVD), physical vapor deposition (PVD), sputtering, plating, chemical solution deposition and electroless plating can be used. Typically, the seed layer has a thickness from 5 nm to 40 nm, with a thickness from 10 nm to 30 nm being more typical. Suitable seed layer materials include Cu, Co and Ru and their alloys (such as Cu(Mn), Cu(Al) and so forth). In preferred embodiments, the thickness of the seed layer is thicker than the barrier layer thicknesses.

As is shown, the recess for the fuse element 305 has a much greater proportionate amount compared to the recesses for the non-fuse features 303 and 304 with the barrier layer and seed layer depositions. This leaves less volume in the e-Fuse recess 305 for the following conductive layer to fill.

Figure 11:
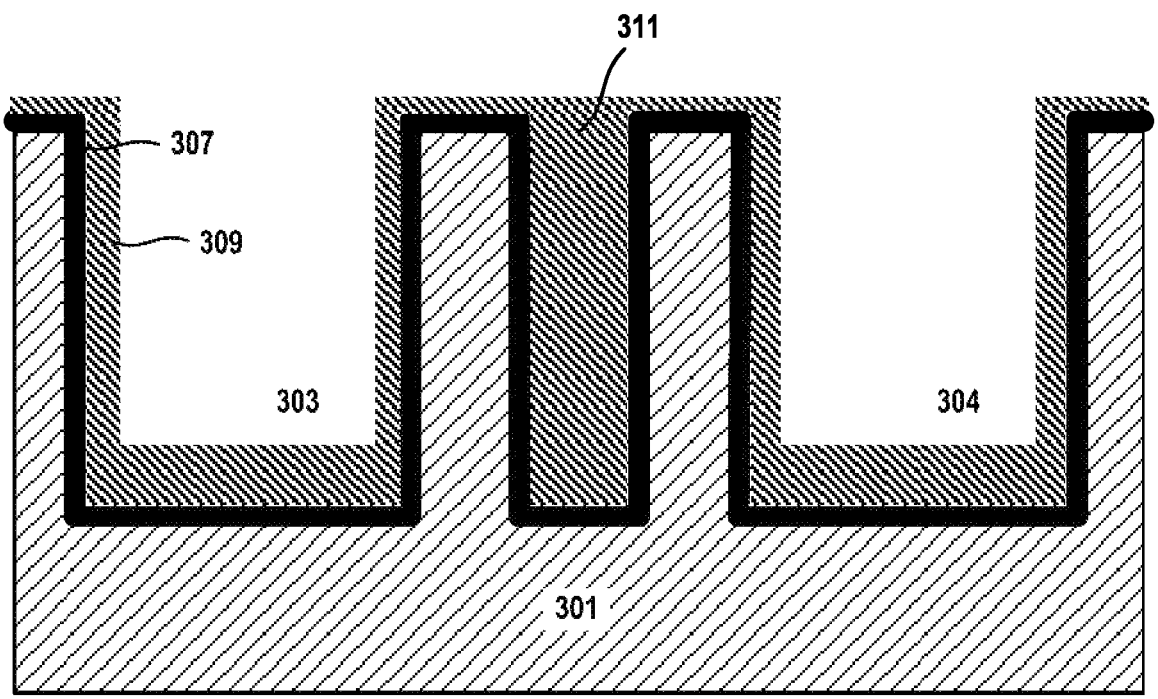
FIG. 11 is a cross-sectional diagram of an e-Fuse structure after an optional seed reflow process according to a first embodiment of the invention.

FIG. 11 is a cross-sectional diagram of an e-Fuse structure after an optional seed reflow process according to a first embodiment of the invention. In this drawing, the seed layer 311 has filled the recess for the fuse element. In embodiments, discussed below, where the seed material has a poorer EM characteristic than the main conductor, the fuse element will be composed of materials which are more likely to create an open. During the reflow process, capillary action will cause the fuse element recess to be filled faster than the recesses for other features due to the greater relative volume of seed layer deposited and the smaller remaining volume to fill. The reflow of the seed layer is accomplished in some embodiments by a thermal anneal at a selected temperature between 100 to 400 degrees Centigrade for 30 minutes~3 hours in a thermal furnace. The thermal anneal can also be carried out at a selected temperature between 400 to 800 degrees Centigrade for 2 seconds~1 minute in a laser anneal plate.

Figure 12:
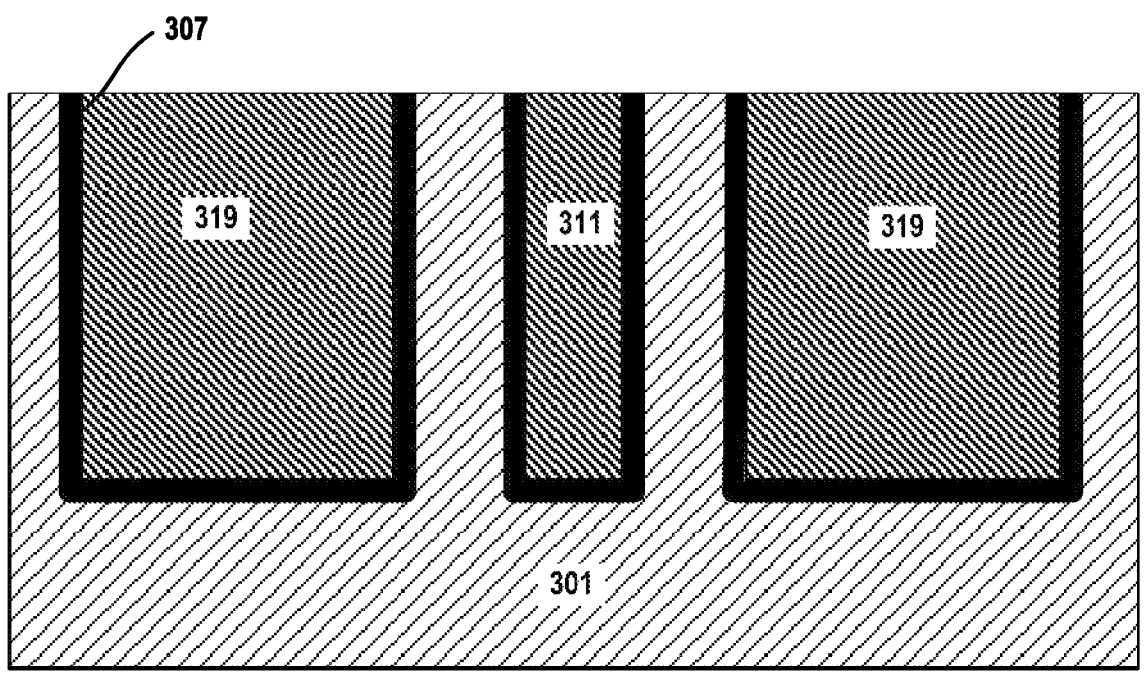
FIG. 12 is a cross-sectional diagram depicting the e-Fuse structure after a metal deposition step and a CMP step have been performed according to a first embodiment of the invention.

FIG. 12 is a cross-sectional diagram depicting the e-Fuse structure after a metal deposition step and a CMP step have been performed according to a first embodiment of the invention. This drawing depicts a point in the process similar to that shown in FIG. 7. In this drawing, a similar metal is selected for the main conductor as the seed layer, so that the hatching of the metal fill of the fuse element 311 and of the other features 319 is uniform. The main conductor is selected from the group of Cu, Ru, Co and W or their alloys in preferred embodiments. Other conductive materials are used for the main conductor in other embodiments. While this embodiment does not have the "extra" EM effect as those embodiments which follow, the proportionately greater cross section taken by the barrier layer 307 in the fuse element 311 as compared to the other features 319 will increase the tendency to create an open in the fuse element 311. This heightens the effect of the already smaller cross-section of the fuse element.

Figure 13:
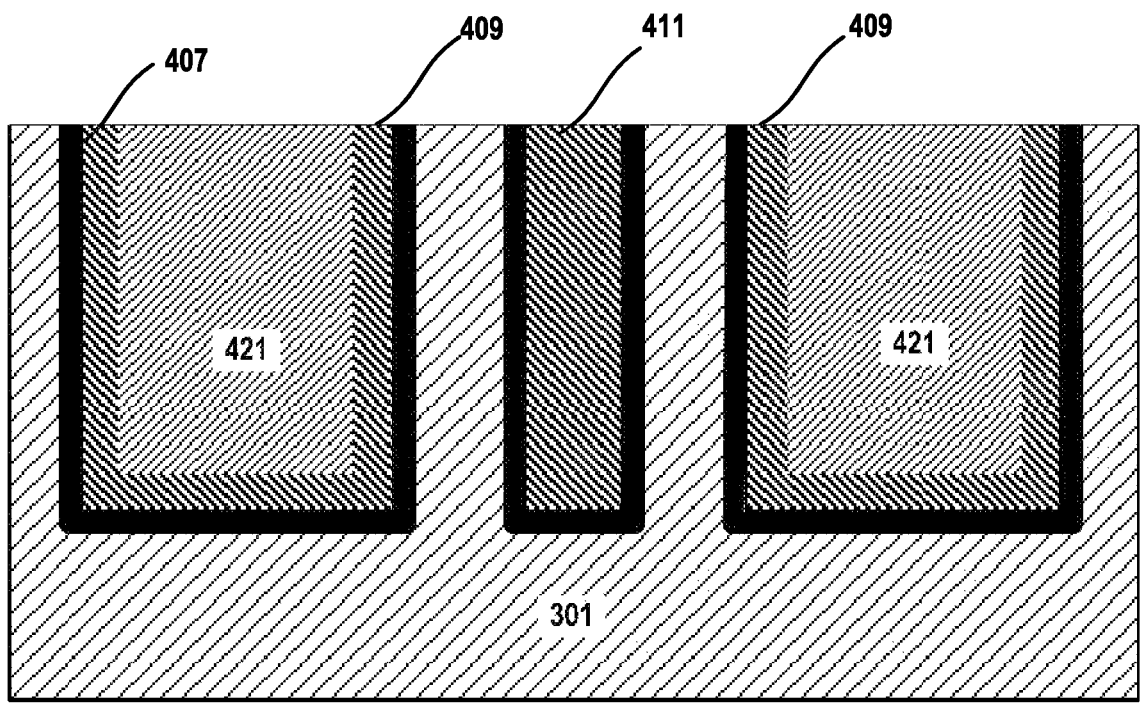
FIG. 13 is a cross-sectional diagram depicting the e-Fuse structure after a metal step and a CMP step have been performed according to a second embodiment of the invention.

FIG. 13 is a cross-sectional diagram depicting the e-Fuse structure after a metal step and a CMP step have been performed according to a second embodiment of the invention. As shown in the drawing, a different metal 421 has been deposited on top of the seed layer 409 in the recesses for the main conductor for the other features. The fuse element is completely filled by the barrier layer 407 and seed layer 411, so by the time that the main conductor metal 421 is deposited, there is no more room in the recess. By selecting a seed layer material with poorer EM characteristics than the main conductor metal, the probability that the open will occur in the fuse element when the programming voltage is increased. A lower programming power is needed.

Figure 14:
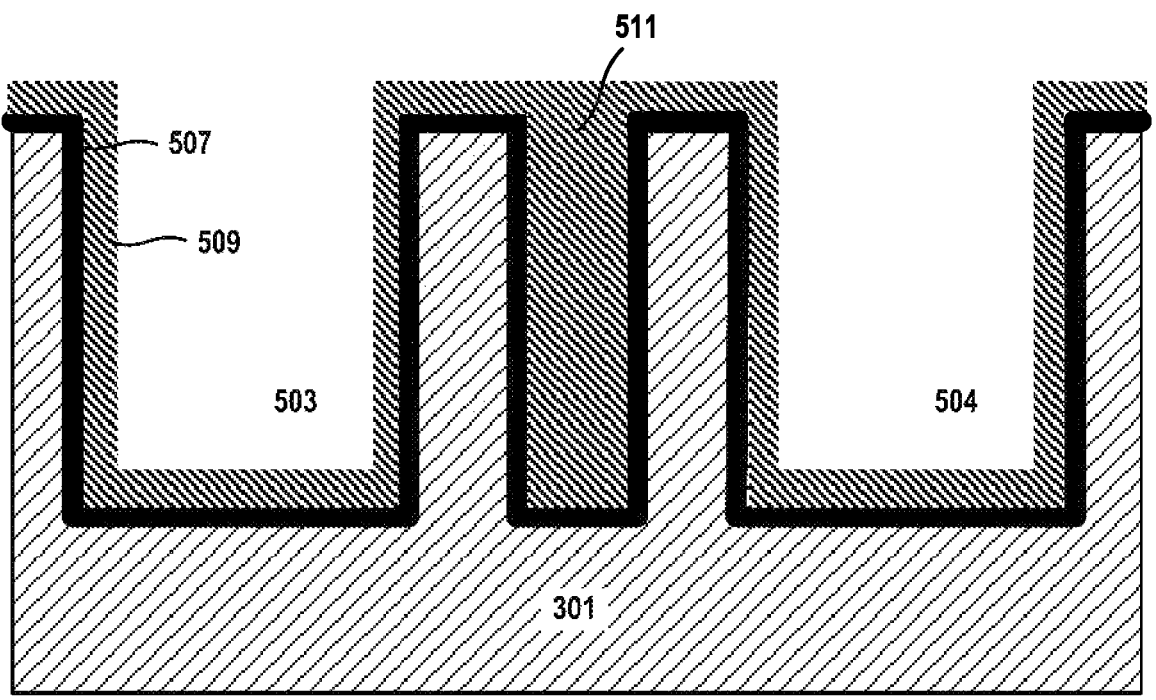
FIG. 14 is a cross-sectional diagram depicting the e-Fuse structure after a liner deposition step, a seed layer deposition step and a seed reflow process have been performed according to a third embodiment of the invention.

FIG. 14 is a cross-sectional diagram depicting the e-Fuse structure after a barrier layer liner deposition step, a seed layer deposition step and a seed reflow process have been performed according to a third embodiment of the invention. In this drawing, the deposition of the barrier layer 507 and the seed layer 509 and the reflow of the seed layer so that it fills the fuse element recess 511 have been performed.

Figure 15:
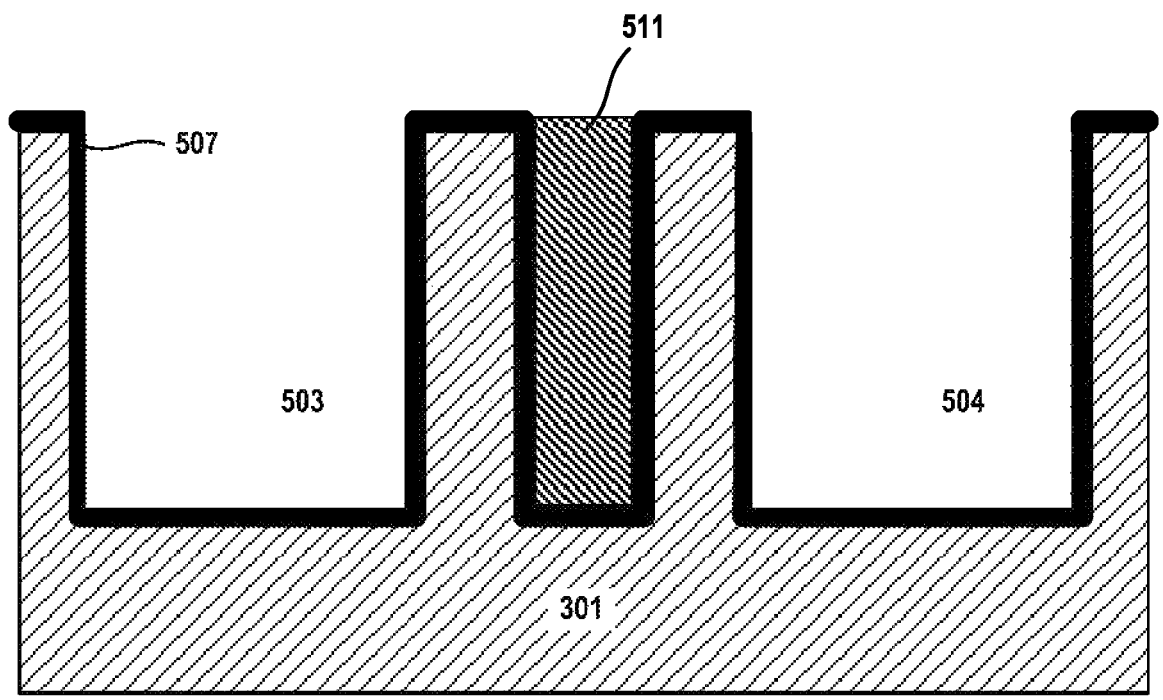
FIG. 15 is a cross-sectional diagram of an e-Fuse structure after a selective removal of the seed metal according to a third embodiment of the invention.

FIG. 15 is a cross-sectional diagram of an e-Fuse structure after a selective removal of the seed metal according to a third embodiment of the invention. The seed metal layer in the recesses 503 and 504 has been removed, leaving only the seed metal 511 in fuse element recess.

Figure 16:
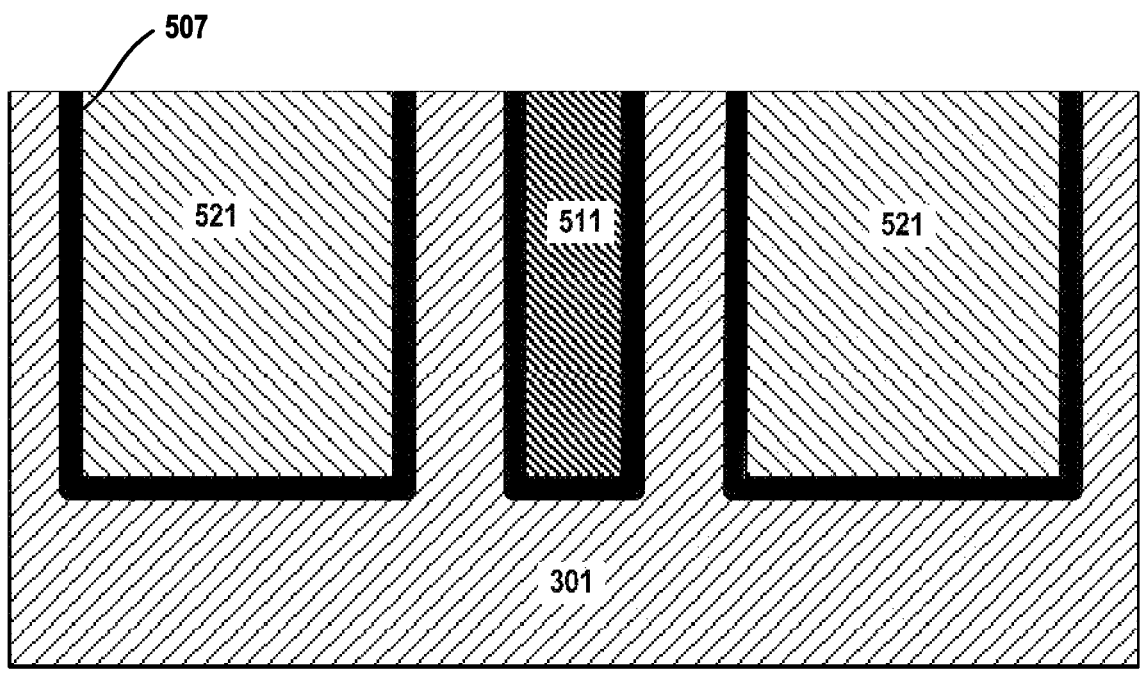
FIG. 16 is a cross-sectional diagram depicting the e-Fuse structure after a fill metal step with an alternate metal and a CMP step have been performed according to a third embodiment of the invention.

FIG. 16 is a cross-sectional diagram depicting the e-Fuse structure after a fill metal step with an alternate main conductor metal and a CMP step have been performed according to a third embodiment of the invention. This embodiment allows an even greater difference between the EM properties of the conductors in the fuse element as compared to the contact lines. The seed metal 511 can be selected to have poor EM characteristics, while the main conductor 521 is selected to have very good EM properties, i.e. EM-resistant. In this embodiment, the seed layer does not serve its normal function of improving the deposition characteristics of the main conductor layer. Since the seed metal has been removed from the non-fuse elements, the difference in current carrying capabilities between the fuse element and the contact lines is increased over an embodiment of the invention in which both seed metal with poor EM resistance and main conductor metal with good EM resistance are present. In embodiments of the invention, TaN is the barrier 507, Cu is the main conductor 521 and Al is a good material for the fuse element 511. In other embodiments, Co as the main conductor 521 and Cu or Al are used as the fuse element 511. In preferred embodiments, the number of steps is minimized by using the same barrier layer material and main conductor material for the contact lines as used in the interconnect layer for active interconnects.

In embodiments of the invention where the barrier property is not needed, e.g., where the seed material and the main conductor material do not diffuse into the ILD, the deposition of the barrier layer is optional. If the "barrier" property is not needed, in alternative embodiments, a liner which improves adhesion of the seed layer and conductor layer can be used instead of one having barrier properties.

The invention takes advantage of a special feature of SADP and SAQP patterning to make an e-Fuse with sub-ground rule fuse elements to enable low power programming. By combining cut sizes in the mandrels and spacer dimensions, embodiments of the invention obtain a sub-ground rule, non-mandrel line for the fuse element. As compared to the standard process used for creating other features of the integrated circuit, embodiments do not require extra masks or processing steps. While the embodiments above have discussed the SADP process, the SAQP patterning process is similar. The main difference is that SAQP patterning splits the mandrels one more time to create finer features. Other sidewall patterning methods are used in other embodiments.

The locality of open created by the smaller cross-section of the fuse element is further enhanced by creating the fuse element with material(s) having a lower EM resistance than that comprising the contact lines which serve as anode and cathode. The fuse element is comprised of different materials than the contact lines in some embodiments. In other embodiments, the lower EM resistance is achieved by increasing the percentage of a lower EM resistance material in the fuse element by depositing the lower EM resistance material in a first deposition and a higher EM resistance in a second deposition, using the narrower geometry of the fuse element to create the differing percentages.

The resulting structure can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an e-Fuse device comprising:
providing a mandrel structure over a dielectric using a patterning process, the mandrel structure including a first mandrel, a second mandrel and a third mandrel, the first, second and third mandrels in a parallel arrangement, the second mandrel located between the first and third mandrels and having a cut larger than a minimum ground rule feature for forming a fuse element and a set of cuts for forming a set of dummy features on either side of the fuse element;
forming a sidewall layer over the mandrel structure so that sidewalls are formed in a sidewall pattern on sidewalls of the mandrel structure, the sidewall pattern having two long parallel gaps for two contact lines and a third gap for the fuse element orthogonal to and connecting the two long parallel gaps;
removing the mandrel structure and using the sidewall pattern to etch the dielectric to form a trench structure comprising two parallel contact line trenches having a width at least as great as a ground rule of the patterning process for the contact lines, a connecting, orthogonal fuse element trench having a width less than the ground rule for the fuse element and a set of recesses for the set of dummy features disposed on either side of the fuse element and between the contact lines; and
filling the trenches with conductive material to form contact lines, a fuse element and a set of dummy features, wherein the contact lines function as an anode and a cathode.

2. The method as recited in claim 1 further comprising depositing a liner layer over the trench structure prior to filling the trench with the conductive material, wherein proportionately more of the fuse element trench is filled with the liner layer than the contact line trenches.

3. The method as recited in claim 2, wherein the second mandrel is used for creating the set of recesses in which the set of dummy features are disposed on either side of the fuse element and between the contact lines.

4. The method as recited in claim 2, further comprising performing a planarization process to remove excess liner layer and conductive material over the dielectric outside the trench.

5. A method for fabricating an e-Fuse device comprising:
providing a mandrel structure over a dielectric using a patterning process, the mandrel structure including a first mandrel, a second mandrel and a third mandrel, the first, second and third mandrels in a parallel arrangement, the second mandrel located between the first and third mandrels and having a cut larger than a minimum ground rule feature;
forming a sidewall layer over the mandrel structure so that sidewalls are formed in a sidewall pattern on sidewalls of the mandrel structure, the sidewall pattern having two long parallel gaps for two contact lines and a third gap for a fuse element orthogonal to and connecting the two long parallel gaps;
removing the mandrel structure and using the sidewall pattern to etch the dielectric to form a trench structure comprising two parallel contact line trenches having a width at least as great as a ground rule of the patterning process for the contact lines and a connecting, orthogonal fuse element trench having a width less than the ground rule for the fuse element; and
filling the trenches with conductive material to form contact lines and a fuse element, wherein the contact lines function as an anode and a cathode, wherein filling the trenches includes
depositing a seed layer before depositing the conductive material in the contact line trenches and the fuse element trench, wherein proportionately more of the fuse element trench is filled with the seed layer than the contact line trenches.

6. The method as recited in claim 5, further comprising performing a seed layer reflow process to fill the fuse element trench with the seed layer while reserving some portion of the contact line trenches for the conductive material.

7. The method as recited in claim 5, further comprising etching the seed layer from the contact line trenches.

8. The method as recited in claim 5, further comprising depositing a liner layer over the trench structure prior to filling the trench with the seed layer, wherein the liner layer is selected from the group consisting of Ta, Ti, W, Co, Ru, TaN, TiN, WN, CoN and RuN, the seed layer is selected from the group consisting of Al, Ag, physical vapor deposited (PVD) Cu, Co and Ru and their alloys and the conductive material is selected from the group consisting of electroplated Cu, Ru, Co and W and their alloys, and wherein the selected seed layer has less electromigration (EM) resistance than the selected conductive material.

9. The method as recited in claim 8, wherein the seed layer is selected to have a lower electro-migration (EM) resistance than the conductive material.

10. The method as recited in claim 5, wherein the second mandrel is used for creating a recess in which active features are disposed on either side of the fuse element and between the contact lines.

11. An e-Fuse device comprising:
an anode contact line and a cathode contact line comprised of conductive material respectively disposed in one of two parallel contact line trenches in a dielectric layer, each contact line trench having a width at least as great as a ground rule of a patterning process;
a fuse element comprised of conductive material in a fuse element trench in the dielectric layer having a width less than the ground rule of the patterning process, the fuse element trench connecting and oriented orthogonally to the contact line trenches; and
a set of dummy features disposed on either side of the fuse element and between the contact lines;
wherein the conductive material comprises a seed layer and a main conductor material, wherein proportionately more of the fuse element trench is filled with the seed layer than the anode contact line and the cathode contact line.

12. The device as recited in claim 11, further comprising a liner layer disposed between the dielectric layer and the conductive material, wherein proportionately more of the fuse element trench is filled with the liner layer than the contact line trenches.

13. The device as recited in claim 12, wherein the seed layer fills a remaining portion of the fuse element trench, the remaining portion consisting of all of the fuse element trench not filled by the liner layer.

14. The device as recited in claim 11, wherein a composition of the conductive material in the contact line trenches is different than that of the conductive material in the fuse element trench, wherein the conductive material in the fuse element trench has less electromigration (EM) resistance than the conductive material in the contact line trenches.

15. An e-Fuse device comprising:
an anode contact line and a cathode contact line comprised of conductive material respectively disposed in one of two parallel contact line trenches in a dielectric layer, each contact line trench having a width at least as great as a ground rule of a patterning process;
a fuse element comprised of conductive material in a fuse element trench in the dielectric layer having a width less than the ground rule of the patterning process, the fuse element trench connecting and oriented orthogonal to the contact line trenches;
a seed layer comprising portions of the anode contact line, the cathode contact line and the fuse element, wherein proportionately more of the fuse element trench is filled with the seed layer than the contact line trenches, wherein the seed layer is selected to have a lower electro-migration (EM) resistance than a main conductor material filling remaining portions of the fuse element and contact line trenches.

16. The device as recited in claim 15, further comprising active features disposed on either side of the fuse element and between the contact lines.

17. The device as recited in claim 15, wherein a main conductor layer fills a remaining portion of the contact line trenches, the remaining portion consisting of all of the contact line trench not filled by a liner layer and the seed layer, wherein the seed layer in the fuse element trench has less electromigration (EM) resistance than the main conductor layer in the contact line trenches.

18. A structure for patterning an e-Fuse device comprising:
a mandrel structure disposed over a dielectric layer, the mandrel structure including a first mandrel, a second mandrel and a third mandrel, the first, second and third mandrels in a parallel arrangement, the second mandrel located between the first and third mandrels and having a cut larger than a minimum ground rule feature, wherein the second mandrel has a set of cuts for forming dummy features between contact lines and on either side of a fuse element;
a sidewall layer disposed over the mandrel structure and dielectric layer so that sidewalls are formed in a sidewall pattern on sidewalls of the mandrel structure, the sidewall pattern having two long parallel gaps for two contact lines and a third gap for the fuse element which is orthogonal to and connects the contact lines;

wherein the contact lines will function as anode and cathode in the e-Fuse device.

19. A method for fabricating an e-Fuse device comprising:

providing a mandrel structure over a dielectric using a patterning process, the mandrel structure including a first mandrel, a second mandrel and a third mandrel, the first, second and third mandrels in a parallel arrangement, the second mandrel located between the first and third mandrels and having a plurality of cuts, at least one of the plurality of cuts larger than a minimum ground rule feature;

forming a sidewall layer over the mandrel structure so that sidewalls are formed in a sidewall pattern on sidewalls of the mandrel structure, the sidewall pattern having two long parallel gaps for two contact lines, a gap for a fuse element orthogonal to and connecting the two long parallel gaps and gaps to form a set of features disposed on either side of the fuse element, wherein a thickness of the sidewall layer is selected so that the gap for the fuse element is less than a minimum ground rule feature;

removing the mandrel structure and using the sidewall pattern to etch the dielectric to form a trench structure comprising two parallel contact line trenches having a width at least as great as a ground rule of the patterning process for the contact lines, a connecting, orthogonal fuse element trench having a width less than the ground rule for the fuse element and a set of recesses for a set of features disposed on either side of the fuse element and between the contact lines; and filling the trenches with a layer of conductive material to form contact lines, a fuse element and a set of features disposed on either side of the fuse element, wherein the contact lines function as an anode and a cathode and the set of features are discrete from other active interconnections formed by sidewalls on the second mandrel.

\* \* \* \* \*